United States Patent [19]

Nagashima

[11] Patent Number: 5,642,319

[45] Date of Patent: Jun. 24, 1997

[54] HIGH-SPEED READ-OUT SEMICONDUCTOR MEMORY

[75] Inventor: Hirokazu Nagashima, Tokyo, Japan

[73] Assignee: NEC Corporation, Tokyo, Japan

[21] Appl. No.: 697,860

[22] Filed: Aug. 30, 1996

[30] Foreign Application Priority Data

Aug. 30, 1995 [JP] Japan .................. 7-222308

[51] Int. Cl.$^6$ .................................. G11C 7/02
[52] U.S. Cl. ................. 365/207; 365/189.05; 365/194; 365/233
[58] Field of Search .................. 365/194, 233, 365/207, 189.05

[56] References Cited

U.S. PATENT DOCUMENTS 5,311,483  5/1994  Takasugi .................. 365/233
5,461,585  10/1995  Chonan .................. 365/194
5,566,108  10/1996  Kitamura .................. 365/233

*Primary Examiner*—David C. Nelms
*Assistant Examiner*—Hien N. Nguyen
*Attorney, Agent, or Firm*—Foley & Lardner

[57] ABSTRACT

In order to decrease peak value of current consumed by sense amplifiers provided in a high-speed read-out semiconductor memory for sensing and amplifying data of certain words of addresses having the same upper bits with upper bits of a read-out address when the upper bits are changed from those of its preceding read-out address, the sense amplifiers are divided into some groups. A group of sense amplifiers for sensing and amplifying data of words including a word indicated by the read-out address is activated firstly and other groups are controlled to be activated a little delayed according to logic of lower bits of the read-out address when the upper bits are changed. Therefore, the peak value of the current consumption Can be decreased without any operational delay.

2 Claims, 5 Drawing Sheets

7~14 :TRANSFER GATE
15,39 :DELAY UNIT
40~47 :INVERTER

HIGH-SPEED READ-OUT SEMICONDUCTOR MEMORY

BACKGROUND OF THE INVENTION

This invention relates to a high-speed read-out semiconductor memory equipped with high-speed read-out function, and more particularly to that able to be driven with a smaller power supply.

FIG. 4 is a block diagram illustrating an example of a conventional high-speed read-out semiconductor memory, comprising;

memory cell units 22, 23, 35 and 36, a first address generator 17 for generating upper bits AD3 to ADn of read-out addresses for the memory cell units 22, 23, 35 and 36, an X-decoder 20 and a Y-decoder 21 for selecting consecutive four words of memory cells from the memory cell units 22, 23, 35 and 36 indicated by the upper bits AD3 to ADn of the read-out addresses, by activating a word line of the memory cell units and controlling Y-selectors 24, 25, 33 and 34, each of which selects a word of bit lines of each of the memory cells 22, 23, 35 and 36 respectively, sense amplifier units 4, 5, 31 and 32, each of which senses and amplifies logic of a word of memory cells delivered through each of the Y-selectors 24, 25, 33 and 34, respectively, latch units 2, 3, 37 and 38 for latching read-out data of the sense amplifier units 4, 5, 31 and 32 respectively, a two bit decoder 26 for controlling one of the latch units 2, 3, 37 and 38 to output its latching data to an output circuit 16 for buffering the read-out data for external output, according to logic of lower two bits AD1 and AD2 of the read-out addresses generated by a second and a third address generators 18 and 19, and a pulse generator 1 for generating a sense amplifier enabling signal DE for controlling the sense amplifier units 4, 5, 31 and 32 and a latch timing signal DL for controlling latch units 2, 3, 37 and 38 at every timing when logic of any of the upper bits AD3 to ADn of the read-out addresses changes.

FIG. 5 is a timing chart illustrating operation of the conventional high-speed read-out semiconductor memory of FIG. 4.

When consecutive addresses are given for read-out a block of data and logic of one, which should be AD3 in the case, of upper bits AD3 to ADn of the addresses are changed at a timing T0 shown in FIG. 5, for example, the pulse generator 1 generates a sense amplifier enabling signal DE and a latch timing signal DL following the timing T0 in that order as shown in FIG. 5.

Every of the sense amplifier units 4, 5, 31 and 32 becomes active during the sense amplifier enabling signal DE is at LOW level and detects and amplifies logic of a word of memory cells delivered through corresponding Y-selector selected by the X and Y-decoders 20 and 21. Thus, data of four words, of which upper bits of each address are the same, are read out at once by the sense amplifier units 4, 5, 31 and 32 as shown in FIG. 5.

Then the latch timing signal DL becomes at LOW level during the sense amplifier enabling signal DE remains at LOW level for controlling every of the latch units 2, 3, 37 and 38 to latch data read out by corresponding each of the sense amplifier units 4, 5, 31 and 32.

These data of four words latched by the latch units 2, 3, 37 and 38 are output after buffered for external output at the output circuit 16, consecutively in the case, according to and following a little after logic of lower two bits AD1 and AD2 of the read-out addresses indicated consecutively at timings T0, T1, T2 and T3, as shown in FIG. 5.

Thus, in the high-speed read-out semiconductor memory of FIG. 4, when a sequence of read-out addresses are given, data of a first word having an address of which logic of upper bits AD1 to ADn is changed are output after processes of memory cell selection, data detection, data latching, selecting a latch unit and data buffering for external output.

But as for data of following words having the same logic of upper bits AD3 to ADn of their read-out addresses, three words when consecutive addresses are given, they can be read out only with processes for selecting a latch unit and data buffering for external output, providing the high-speed read-out.

Here, pulse width of the sense amplifier enabling signal DE is prepared for suppressing current consumed by the sense amplifier units 4, 5, 31 and 32 to a minimum value.

The current consumed by the sense amplifier units 4, 5, 31 and 32 adds up to more than half of the total power dissipation of the high-speed read-out semiconductor memory. And further, peak value of the current Ic of FIG. 5 consumed at once in a short period by the sense amplifiers increases in proportion to number of sense amplifiers, which is given by product of bit width of a word and number of words to be read out at once by the sense amplifier units, four in the example of the high-speed read-out semiconductor memory of FIG. 4.

Therefore, a power supply having a sufficient capacity must be provided for driving a large number of sense amplifiers at once in the conventional high-speed read-out semiconductor memory.

This is a problem.

SUMMARY OF THE INVENTION

Therefore, a primary object of the invention is to provide a high-speed read-out semiconductor memory able to be driven with a smaller power supply compared to number of sense amplifiers prepared therein.

In order to achieve the object, a high-speed read-out semiconductor memory of the invention comprises:

four units of memory cells;

an address generator for generating an read-out address of a word to be read out from said four units of memory cells;

selecting means for selecting four words of memory cells according to said read-out address, each of said four words being selected from each of said four units of memory cells and each of addresses of said four words having the same upper bits than a second lower bit thereof with each other;

four sense amplifier units, each of said four sense amplifier units sensing and amplifying data stored in each of said four words of memory cells selected by said selecting means;

four latch units, each of said four latch units latching a word of data sensed and amplified by each of said four sense amplifier units;

a decoder for controlling one of said four latch units to output data latched therein, decoding and according to logic of lower two bits of said read-out address;

a pulse generator for generating a sense amplifier enabling signal and a latch timing signal, said latch timing signal becoming active in a latter part of a period when said sense amplifier enabling signal becomes active following every timing when upper bits than second lower bit of said read-out address differ from those of a preceding read-out address of said read-out address; and a selective delay circuit for generating two pairs of an enabling signal and a timing signal according to logic of a second lower bit of said read-out address when upper bits than said second lower bit of said read-out address differ from those of a preceding read-out address of said read-out address, each of said two pairs of an enabling signal and a timing signal having the same wave forms to said sense amplifier enabling signal and said latch timing signal generated by said pulse generator and making active two said four sense amplifier units and two of said four latch units, each of said two of said four latch units corresponding to each of said two of said four sense amplifier units which sense and amplify data of each of two words of said four words selected by said selecting means, logic of second lower bits of said two words being the same, and one, corresponding to two words including a word indicated by said read-out address, of said two pairs of an enabling signal and a timing signal being synchronized to said sense amplifier enabling signal and said latch timing signal, and the other of said two pairs of an enabling signal and a timing signal being delayed from said sense amplifier enabling signal and said latch timing signal.

Therefore, sense amplifiers are activated half by half without any operational delay in the high-speed read-out semiconductor memory of the invention, decreasing peak value of current consumption into about half of the conventional high-speed read-out semiconductor memory.

BRIEF DESCRIPTION OF THE DRAWINGS

The foregoing, further objects, features, and advantages of this invention will become apparent from a consideration of the following description, the appended claims, and the accompanying drawings in which the same numerals indicate the same or the corresponding parts.

DETAILED DESCRIPTION OF THE PREFERRED EMBODIMENTS

Now, embodiments of the present invention will be described in connection with the drawings.

Figure 1:
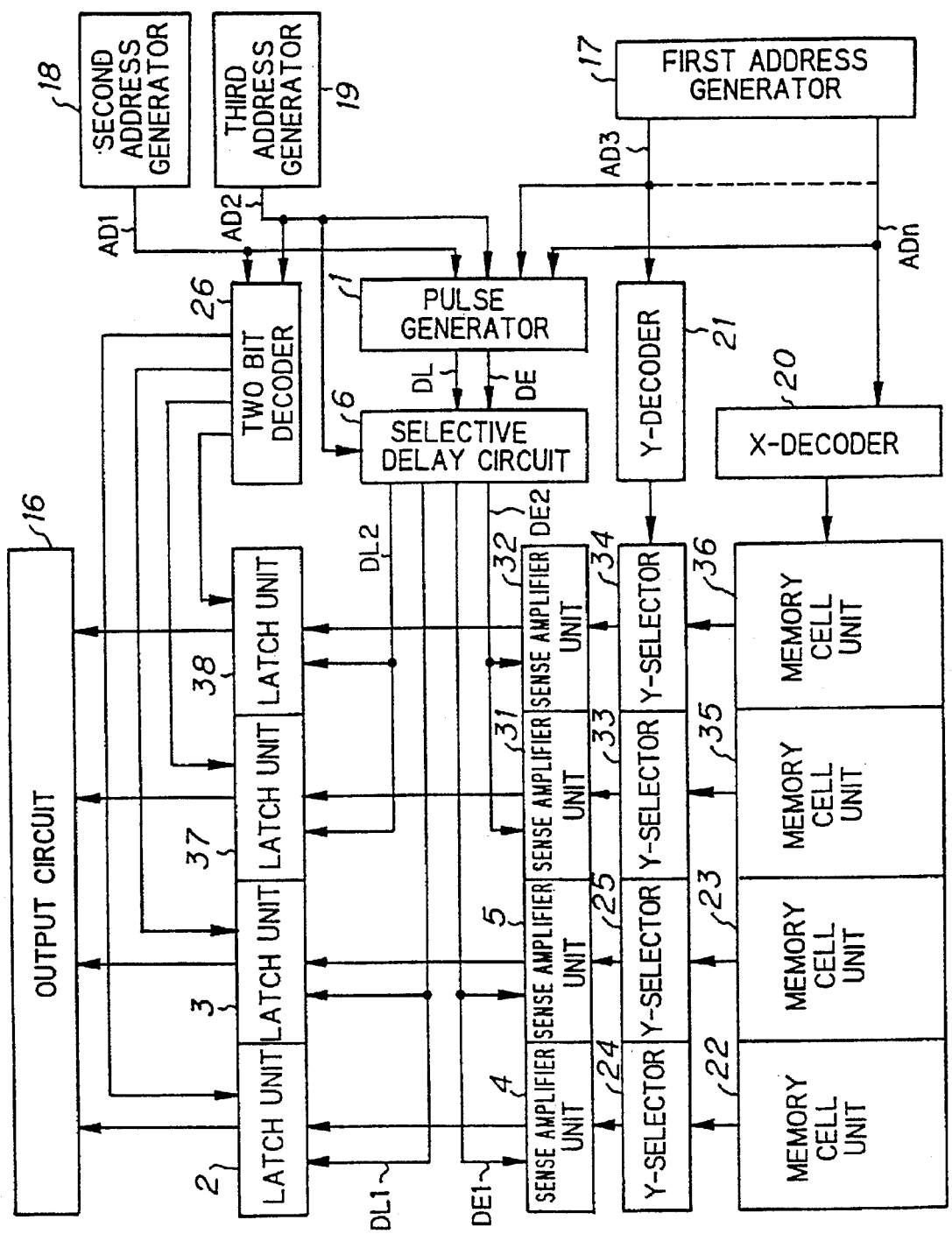
FIG. 1 is a block diagram illustrating an embodiment of the invention.
Figure 4:
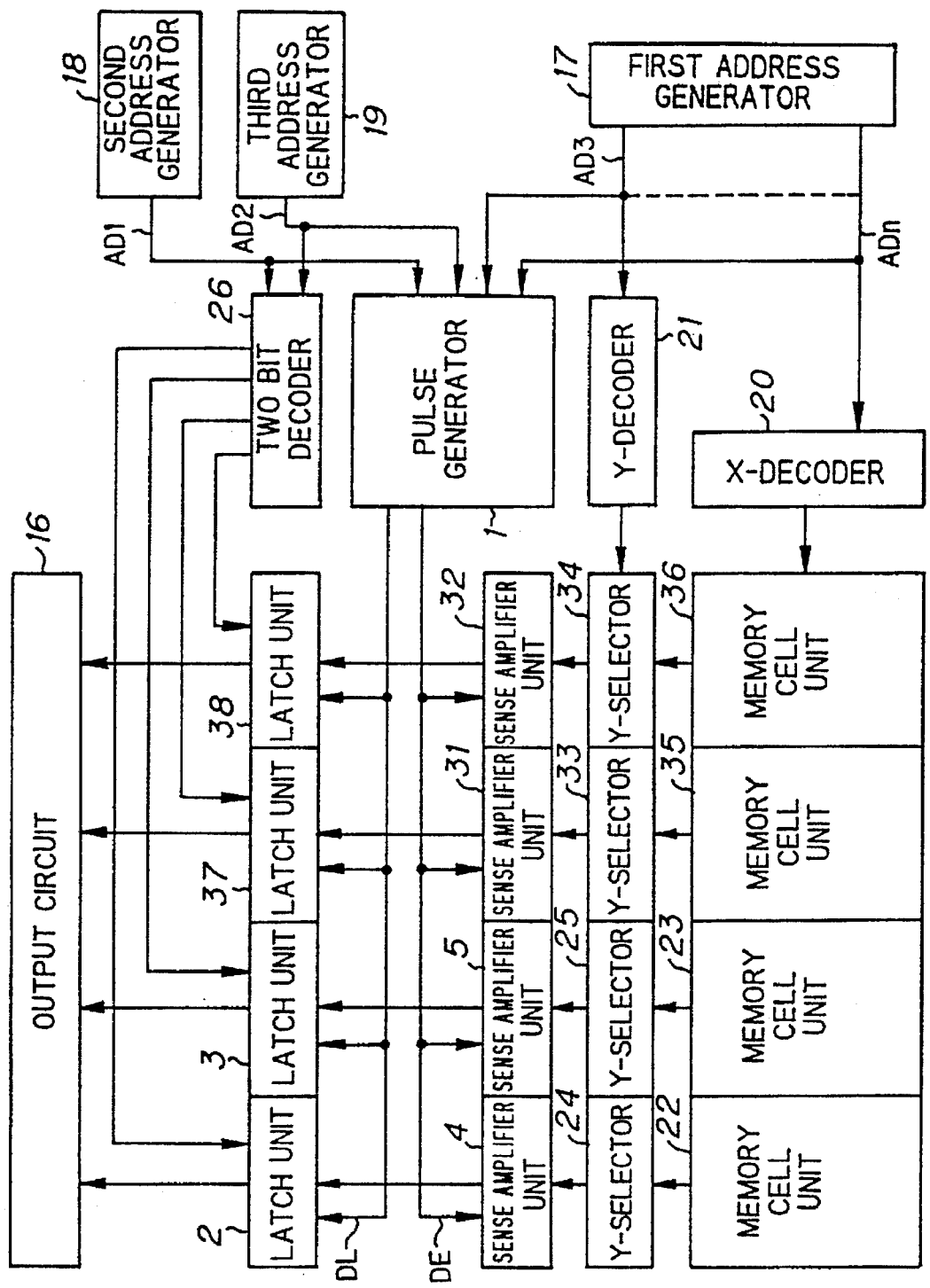
FIG. 4 is a block diagram illustrating an example of a conventional high-speed read-out semiconductor memory.
Figure 5:
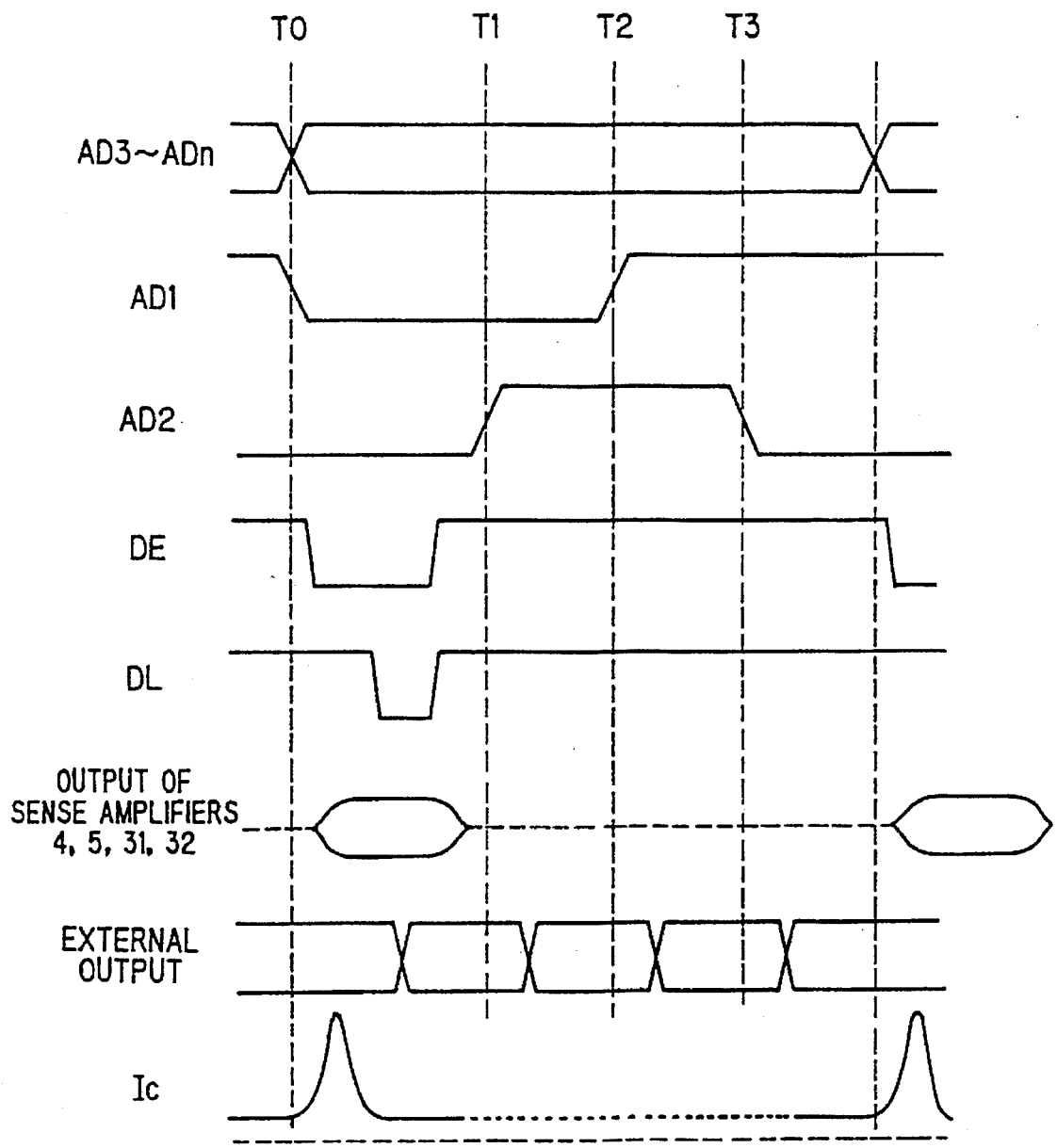
FIG. 5 is a timing chart illustrating operation of the conventional high-speed read-out semiconductor memory of FIG. 4.

FIG. 1 is a block diagram illustrating an embodiment of the invention, wherein comprised in the same way as in the conventional high-speed read-out memory of FIG. 4;

memory cell units 22, 23, 35 and 36, a first address generator 17 for generating upper bits AD3 to ADn of read-out addresses for the memory cell units 22, 23, 35 and 36, an X-decoder 20 and a Y-decoder 21 for selecting consecutive four words of memory cells from the memory cell units 22, 23, 35 and 36 indicated by the upper bits AD3 to ADn of the read-out addresses, by activating a word line of the memory cell units and controlling Y-selectors 24, 25, 33 and 34, each of which selects a word of bit lines of each of the memory cells 22, 23, 35 and 36 respectively, sense amplifier units 4, 5, 31 and 32, each of which senses and amplifies logic of a word of memory cells delivered through each of the Y-selectors 24, 25, 33 and 34, respectively, latch units 2, 3, 37 and 38 for latching read-out data of the sense amplifier units 4, 5, 31 and 32 respectively, a two bit decoder 26 for controlling one of the latch units 2, 3, 37 and 38 to output its latching data to an output circuit 16 for buffering the read-out data for external output, according to logic of lower two bits AD1 and AD2 of the read-out addresses generated by a second and a third address generators 18 and 19, and a pulse generator 1 for generating a sense amplifier enabling signal DE and a latch timing signal DL at every timing when logic of any of the upper bits AD3 to ADn of the read-out addresses changes.

However, in the embodiment of FIG. 1, the sense amplifier abling signal DE or the latch timing signal DL is not delivered directly to the sense amplifier units 4, 5, 31 and 32 or to the latch units 2, 3, 37 and 38.

A selective delay circuit 6 is further provided in the embodiment for generating a pair of a first enabling signal DE1 and a first timing signal DL1, which control the sense amplifier units 4 and 5 and the latch units 2 and 3 respectively, and another pair of a second enabling signal DE2 and a second timing signal DL2 which control the sense amplifier units 31 and 32 and the latch units 37 and 38 respectively.

One of the two pair is obtained by delaying the sense amplifier enabling signal DE and the latch timing signal DL for a period, while the other pair is obtained directly from the sense amplifier enabling signal DE and the latch timing signal DL, and the pair to be delayed is selected according to logic of the second lower bit AD2 of the read-out address at the timing when the sense amplifier enabling signal DE and the latch timing signal DL are generated.

Figure 2:
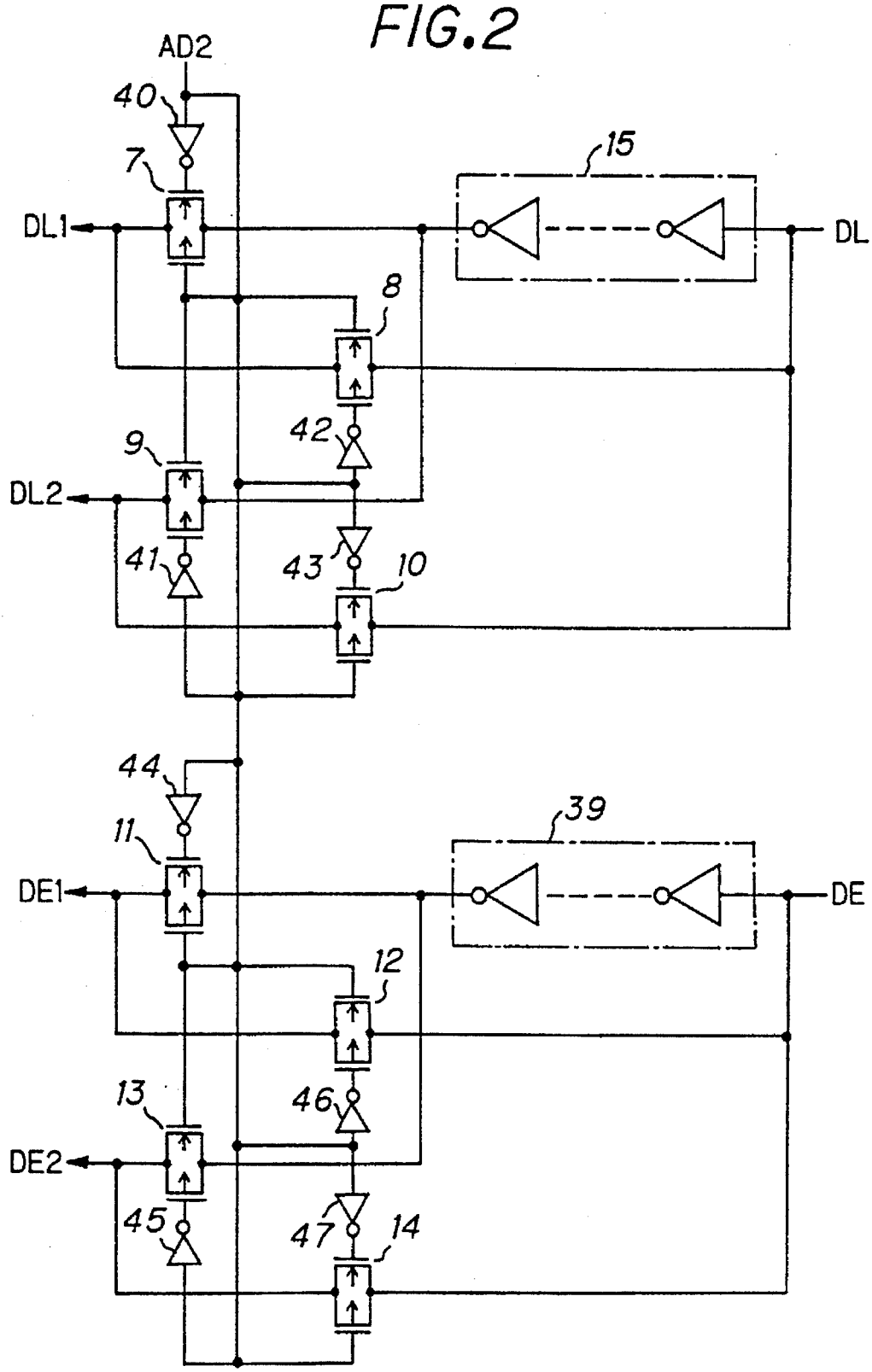
FIG. 2 is a circuit diagram illustrating configuration of an example of the selective delay circuit 6 of FIG. 1.

FIG. 2 is a circuit diagram illustrating configuration of an example of the selective delay circuit 6, comprising transfer gates 7 to 14, delay units 15 and 39 and inverters 40 to 47.

The latch timing signal DL delivered from the pulse generator 1 is supplied to the delay unit 15 and the transfer gates 8 and 10, while the sense amplifier enabling signal DE supplied to the delay unit 39 and the transfer gates 12 and 14.

When the second lower bit AD2, delivered from the third address generator 19 and supplied to the inverters 40 to 47 and the transfer gates 7 to 14, is at HIGH level, the transfer gates 7, 10, 11 and 14 are controlled at status ON and the other transfer gates 8, 9, 12 and 13 at status OFF, and vice versa when it is at LOW level.

Therefor, when the second lower bit AD2 is at HIGH level, the sense amplifier enabling signal DE and the latch timing signal DL are output as the second enabling signal DE2 and the second timing signal DL2 directly through the transfer gates 10 and 14 respectively, and output as the first enabling signal DE1 and the first timing signal DL1 after delayed by the delay units 15 and 39 through the transfer gates 7 and 11. And when the second lower bit AD2 is at low level, they are output directly as the first enabling signal DE1 and the first timing signal DL1, and output after delayed as the second enabling signal DE2 and the second timing signal DL2.

Figure 3:
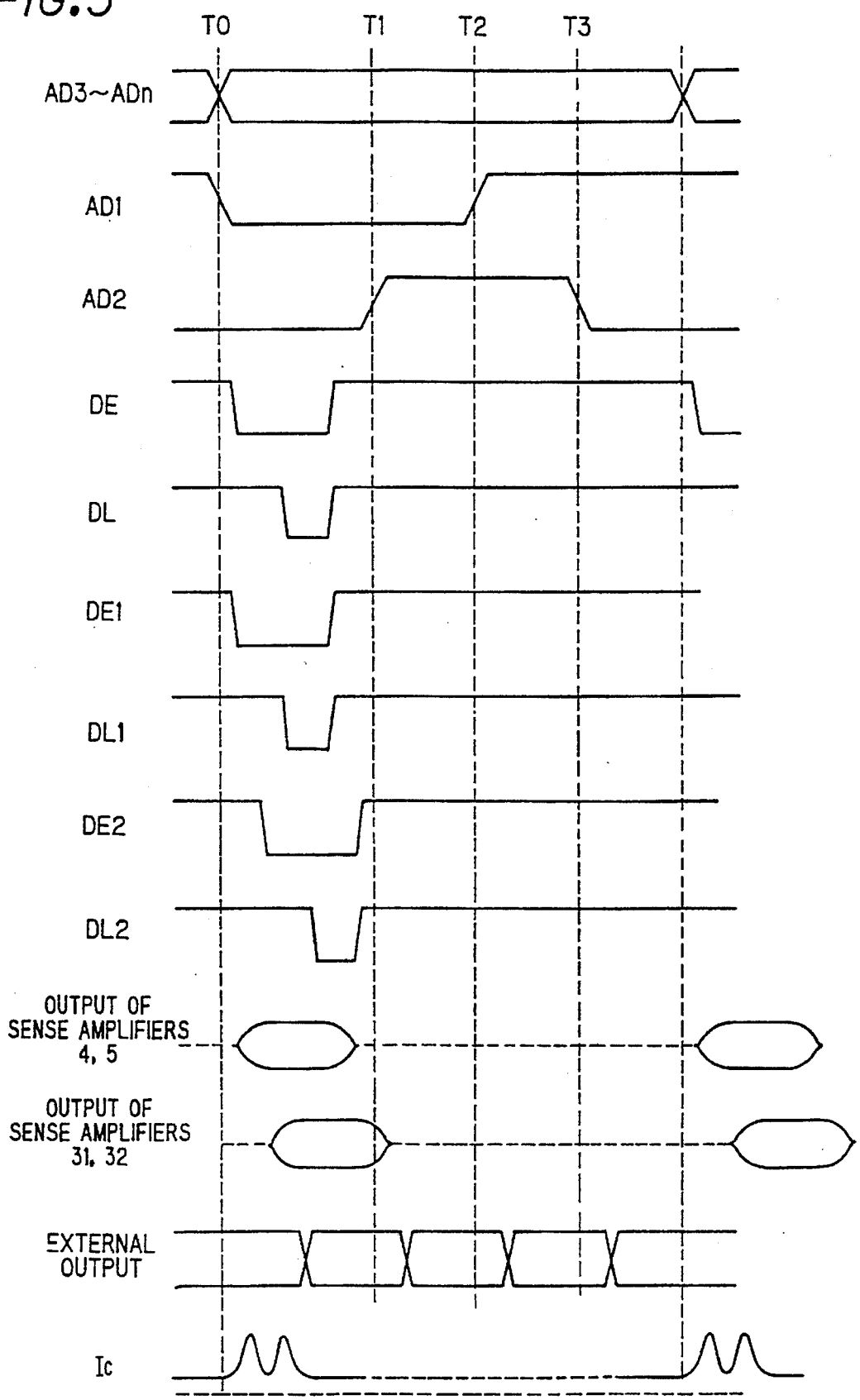
FIG. 3 is a timing chart illustrating signals in the embodiment of FIG. 1.

Now, returning to FIG. 1, operation of the embodiment is described referring to a timing chart of FIG. 3 illustrating signals in the embodiment.

Suppose a case when a sequence of consecutive read-out addresses are given to the embodiment.

Four words of memory cells are selected by the X and Y-decoder in the same way as in the conventional high-speed read-out memory of FIG. 4 at a timing T0 of FIG. 3 when a read-out address, of which logic of upper bits AD3 to ADn is changed, is given and the sense amplifier enabling signal DE and the latch timing signal DL are generated too following the timing T0.

Then, in the embodiment, the first enabling signal DE1 and the first timing signal DL1 become active in that order by turning to LOW level synchronized with the sense amplifier enabling signal DE and the latch timing signal DL as shown in FIG. 3, since lower two bits AD1 and AD2 of the read-out address are to be "00" and the second lower bit AD2 is to be at LOW level in the case. So, the sense amplifiers 4 and 5 become active and two words of data selected by the Y-selectors 24 and 25 are detected to be latched by the latch units 2 and 3 and a word of data latched by the latch unit 2, corresponding to the logic "00" of the lower two bits AD1 and AD2, are output through the output circuit 16 controlled by the two bit decoder 26.

Meanwhile, the second enabling signal DE2 and the second timing signal DL2 become active by turning to LOW level as shown in FIG. 3, both a period delayed from the first enabling signal DE1 and the first timing signal DL1, other two words of data selected by the Y-selectors 31 and 32 being detected by the sense amplifier units 31 and 32 and latched by the latch unit 37 and 38.

Then, at a timing T1 of FIG. 3 when a following address is given, of which upper bits AD3 to ADn are to be the same with those of preceding address, a word of data already latched by the latch unit 3, corresponding to the logic "01" of lower two bits AD1 and AD2 of the present address, are output through the output circuit 16 selected by the two bit decoder 26.

Thus, following three words, in the case, having the same logic of upper bits AD3 to ADn of their read-out addresses are similarly read out omitting the processes for memory cell selection, data detection and data latching.

In a case second lower bit AD2 is at logic HIGH when logic of upper bits AD3 to ADn of a read-out address is changed, lower two bits AD1 and AD2 being "10" for example, the second enabling signal DE2 and the second timing signal DL2 become active firstly synchronized with the sense amplifier enabling signal DE and the latch timing signal DL generated by the pulse generator 1, since the selective delay circuit 6 is controlled by logic HIGH of the second lower bit AD2.

So, data selected by the Y-selectors 33 and 34 are detected by the sense amplifier 31 and 32 to be latched by the latch units 37 and 38, and the data latched by the latch unit 37, corresponding to logic "10" of the lower two bits AD1 and AD2 of the read-out address, are output through the output circuit 16 controlled by the two bit decoder 26, without any additional delay. And data of a following word having consecutive address can be output from data already latched by the latch unit 38 corresponding to logic "11" of the lower two bit AD1 and AD2 controlled by the two bit decoder 26.

It goes without saying that data of other two word latched by the latch unit 2 and 3 can be also output without new sense-amplifying if read-out addresses having the same upper bits AD3 to ADn were given backward going.

Thus, a high-speed read-out is provided in the embodiment as well as in the conventional high-speed read-out semiconductor memory of FIG. 4, and, in the embodiment, the sense amplifier units 4 and 5 and the latch unit 2 and 3 are activated at a different timing from the sense amplifier units 31 and 32 and the latch unit 37 and 38, decreasing peak value of the current consumption Ic into about a half of the conventional high-speed read-out semiconductor memory as shown in FIG. 2.

Heretofore is described an embodiment of the present invention having sense amplifier units divided into two groups, each of which is activated separately for sensing and amplifying two words of memory cells at once controlled according to logic of second lower bit of a read-out address which has upper bits than the second lower bit different from those of its preceding read-out address.

However, it can be easily understood that there can be provided, in the scope of the present invention, a high-speed read-out semiconductor memory having sense amplifier units divided into $2^i$ groups, each of which is activated separately by an apropriate period from each other group for sensing and amplifying $2^{j-1}$ word(s) of memory cells at once controlled according to logic of i bit(s) from j-th lower bit to (i+j−1)-th lower bit of a read-out address having upper bits than the (i+j−1)-th lower bit different from those of its preceding read-out address, i and j being positive integers.

What is claimed is:

1. A high-speed read-out semiconductor memory comprising:

$2^{i+j-1}$ units of memory cells, i and j being positive integers;

an address generator for generating an read-out address of a word to be read out from said $2^{i+j-1}$ units of memory cells;

selecting means for selecting $2^{i+j-1}$ words of memory cells according to said read-out address, each of said $2^{i+j-1}$ words being selected from each of said $2^{i+j-1}$ units of memory cells and each of addresses of said $2^{i+j-1}$ words having the same upper bits than an (i+j−1)-th lower bit thereof with each other;

$2^{i+j-1}$ sense amplifier units, each of said $2^{i+j-1}$ sense amplifier units sensing and amplifying data stored in each of said $2^{i+j-1}$ words of memory cells selected by said selecting means;

$2^{i+j-1}$ latch units, each of said $2^{i+j-1}$ latch units latching a word of data sensed and amplified by each of said $2^{i+j-1}$ sense amplifier units;

a decoder for controlling one of said $2^{i+j-1}$ latch units to output data latched therein, decoding and according to logic of lower i+j−1 bit(s) of said read-out address;

a pulse generator for generating a sense amplifier enabling signal and a latch timing signal, said latch timing signal becoming active in a latter part of a period when said sense amplifier enabling signal becomes active following every timing when upper bits than (i+j−1)-th lower bit of said read-out address differ from those of a preceding read-out address of said read-out address; and a selective delay circuit for generating $2^i$ pairs of an enabling signal and a timing signal according to logic of i bit(s) from a j-th lower bit to (i+j−1)-th lower bit of said read-out address when upper bits than the (i+j−1)-th lower bit of said read-out address differ from those of a preceding read-out address of said read-out address, each of said $2^i$ pairs of an enabling signal and a timing signal having the same wave forms to said sense amplifier enabling signal and said latch timing signal generated by said pulse generator and matting active $2^{j-1}$ of said $2^{i+j-1}$ sense amplifier units and $2^{j-1}$ of said $2^{i+j-1}$ latch units, each of said $2^{j-1}$ of said $2^{i+j-1}$ latch units corresponding to each of said $2^{j-1}$ of said $2^{i+j-1}$ sense amplifier units which senses and amplifies data of each of $2^{j-1}$ word(s) of said $2^{i+j-1}$ words selected by said selecting means, logic of i bit(s) from a j-th lower bit to an (i+j−1)-th lower bit of each of said $2^{j-1}$ word(s) being the same with each other, and one, corresponding to $2^{j-1}$ word(s) including a word indicated by said read-out address, of said $2^i$ pairs of an enabling signal and a timing signal being synchronized to said sense amplifier enabling signal and said latch timing signal, and the other(s) of said $2^i$ pairs of an enabling signal and a timing signal being delayed from said sense amplifier enabling signal and said latch timing signal.

2. A high-speed read-out semiconductor memory comprising:

four units of memory cells;

an address generator for generating an read-out address of a word to be read out from said four units of memory cells;

selecting means for selecting four words of memory cells according to said read-out address, each of said four words being selected from each of said four units of memory cells and each of addresses of said four words having the same upper bits than a second lower bit thereof with each other;

four sense amplifier units, each of said four sense amplifier units sensing and amplifying data stored in each of said four words of memory cells selected by said selecting means;

four latch units, each of said four latch units latching a word of data sensed and amplified by each of said four sense amplifier units;

a decoder for controlling one of said four latch units to output data latched therein, decoding and according to logic of lower two bits of said read-out address;

a pulse generator for generating a sense amplifier enabling signal and a latch timing signal, said latch timing signal becoming active in a latter part of a period when said sense amplifier enabling signal becomes active following every timing when upper bits than second lower bit of said read-out address differ from those of a preceding read-out address of said read-out address; and a selective delay circuit for generating two pairs of an enabling signal and a timing signal according to logic of a second lower bit of said read-out address when upper bits than said second lower bit of said read-out address differ from those of a preceding read-out address of said read-out address, each of said two pairs of an enabling signal and a timing signal having the same wave forms to said sense amplifier enabling signal and said latch timing signal generated by said pulse generator and making active two said four sense amplifier units and two of said four latch units, each of said two of said four latch units corresponding to each of said two of said four sense amplifier units which senses and amplifies data of each of two words of said four words selected by said selecting means, logic of second lower bits of said two words being the same, and one, corresponding to two words including a word indicated by said read-out address, of said two pairs of an enabling signal and a timing signal being synchronized to said sense amplifier enabling signal and said latch timing signal, and the other of said two pairs of an enabling signal and a timing signal being delayed from said sense amplifier enabling signal and said latch timing signal.

* * * * *